United States Patent
Lee et al.

(10) Patent No.: US 8,502,205 B2
(45) Date of Patent: Aug. 6, 2013

(54) ORGANIC LIGHT EMITTING DIODE DEVICE AND METHOD OF MANUFACTURING THE SAME

(75) Inventors: Joon-Gu Lee, Yongin (KR); Jong-Hyuk Lee, Yongin (KR); Won-Jong Kim, Yongin (KR); Ji-Young Choung, Yongin (KR); Kyu-Ilwan Kwang, Yongin (KR); Yong-Tak Kim, Yongin (KR); Jin-Baek Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 231 days.

(21) Appl. No.: 12/923,980

(22) Filed: Oct. 19, 2010

(65) Prior Publication Data

US 2011/0121351 A1 May 26, 2011

(30) Foreign Application Priority Data

Nov. 25, 2009 (KR) ........................ 10-2009-0114807

(51) Int. Cl.
*H01L 29/08* (2006.01)
*H01L 35/24* (2006.01)
*H01L 51/00* (2006.01)

(52) U.S. Cl.
USPC ................... 257/40; 438/99; 257/E51.018

(58) Field of Classification Search
USPC .................................... 257/E51.019
See application file for complete search history.

(56) References Cited

U.S. PATENT DOCUMENTS

| | | | |
|---|---|---|---|
| 2006/0049419 A1* | 3/2006 | Tanaka et al. | 257/98 |
| 2006/0186804 A1 | 8/2006 | Sakaura et al. | |
| 2008/0238832 A1 | 10/2008 | Ishii et al. | |
| 2008/0265751 A1* | 10/2008 | Smith et al. | 313/504 |
| 2009/0153032 A1 | 6/2009 | Tomai et al. | |
| 2010/0045176 A1 | 2/2010 | Kim et al. | |

FOREIGN PATENT DOCUMENTS

| | | |
|---|---|---|
| JP | 2006-066553 A | 3/2006 |
| KR | 10 2007-0071978 A | 7/2007 |
| KR | 10 2008-0039960 A | 5/2008 |
| KR | 10 2008-0043180 A | 5/2008 |
| KR | 10 2008-0090271 A | 10/2008 |
| KR | 10 2009-0007664 A | 1/2009 |
| KR | 10 2010-0022713 A | 3/2010 |

OTHER PUBLICATIONS

Smith in view of Xie et al. "Modification of the electrodes of organic-light-emitting devices using the SnO2 ultrathin layer", Semicond., Sci., Technol. 19 (2004) 380-383.*
Choi, et al., Effect of Magnesium Oxide Buffer Layer on Performance of Inverted Top-Emitting Organic Light-Emitting Diodes, Journal of Applied Physics, 2006, 064106-1-6, 100, Pohang University of Science and Technology, Pohang, Kyungbuk 790-784, Korea.

* cited by examiner

*Primary Examiner* — Michelle Mandala
*Assistant Examiner* — Shaka White
(74) *Attorney, Agent, or Firm* — Lee & Morse, P.C.

(57) ABSTRACT

An organic light emitting diode (OLED) device and a method of manufacturing the same, the OLED device including a substrate, a first electrode on the substrate, a buffer layer on the first electrode, an emission layer on the buffer layer, and a second electrode on the emission layer, wherein the buffer layer includes a transparent conductive oxide, and a metal or metal oxide having a work function lower than a work function of the transparent conductive oxide.

20 Claims, 3 Drawing Sheets

ORGANIC LIGHT EMITTING DIODE DEVICE AND METHOD OF MANUFACTURING THE SAME

BACKGROUND

1. Field

Embodiments relate to an organic light emitting diode (OLED) device and a method of manufacturing the same.

2. Description of the Related Art

An organic light emitting diode (OLED) device emits light when electrons injected from one electrode are combined with holes injected from another electrode in an emission layer between the electrodes and generates an exciton, which releases energy in the form of light.

Since the organic light emitting diode (OLED) device emits light without a separate light source, it has very low power consumption.

In order to further reduce power consumption, it may be desirable to increase luminous efficiency of the organic light emitting diode (OLED) device.

SUMMARY

Embodiments are directed to an organic light emitting diode (OLED) device and a method of manufacturing the same, which represent advances over the related art.

It is a feature of an embodiment to provide an organic light emitting diode (OLED) device being capable of easily injecting electrons and holes from an electrode to an emission layer and improving luminous efficiency.

At least one of the above and other features and advantages may be realized by providing an organic light emitting diode (OLED) device including a substrate, a first electrode on the substrate, a buffer layer on the first electrode, an emission layer on the buffer layer, and a second electrode on the emission layer, wherein the buffer layer includes a transparent conductive oxide, and a metal or metal oxide having a work function lower than a work function of the transparent conductive oxide.

The transparent conductive oxide may have a work function of about 3.0 to about 5.0 eV.

The transparent conductive oxide may include an oxide of at least one of indium, zinc, and tin.

The metal or metal oxide may have a work function of about 2 to about 4 eV.

The buffer layer may include the metal, the metal including at least one of Ca, Mg, Sm, Cs, Ba, Sr, Y, and La.

The buffer layer may include the metal oxide, the metal oxide including an oxide of at least one of Ca, Mg, Sm, Cs, Ba, Sr, Y, and La.

The metal or metal oxide may be included in an amount of about 0.5 wt % to about 20 wt % based on a total weight of the buffer layer.

The buffer layer may have a work function of about 3.6 eV to about 4.7 eV.

The buffer layer may a transmittance of about 80% or greater at a wavelength of about 400 nm to about 700 nm.

The buffer layer may have a thickness of about 0.1 Å to about 1000 Å.

At least one of the above and other features and advantages may also be realized by providing a method of manufacturing an organic light emitting diode (OLED) device, the method including forming a first electrode on a substrate, forming a buffer layer on the first electrode, forming an emission layer on the buffer layer, and forming a second electrode on the emission layer, wherein the buffer layer includes a transparent conductive oxide, and a metal or metal oxide having a work function lower than a work function of the transparent conductive oxide.

The buffer layer may include the metal, the metal including at least one of Ca, Mg, Sm, Cs, Ba, Sr, Y, and La.

The buffer layer may include the metal oxide, the metal oxide including an oxide of at least one of Ca, Mg, Sm, Cs, Ba, Sr, Y, and La.

Forming the buffer layer may include sputtering, evaporating, or wet coating.

Forming the buffer layer may include co-sputtering using a target of transparent conductive oxide and a target of metal or metal oxide.

Oxygen gas may be supplied during the sputtering.

The oxygen gas may be supplied at a flow rate of about 0.01 sccm to about 1 sccm.

The buffer layer may have a work function of about 3.6 eV to about 4.7 eV and a transmittance of about 80% or greater at a wavelength region of about 400 nm to about 700 nm.

The metal of metal oxide may have a work function of about 2 eV to about 4 eV.

The transparent conductive oxide may have a work function of about 3.0 eV to about 5.0 eV.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
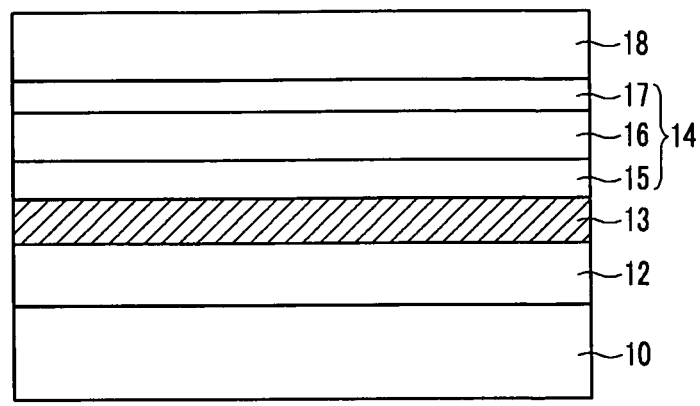
FIG. 1 illustrates a schematic cross-sectional view of an organic light emitting diode (OLED) device according to an embodiment.

Korean Patent Application No. 10-2009-0114807, filed on Nov. 25, 2009, in the Korean Intellectual Property Office, and entitled: "Organic Light Emitting Diode Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of an OLED device according to an embodiment.

Referring to FIG. 1, the OLED device may include a substrate 10, a first electrode 12 disposed on the substrate 10, a buffer layer 13 disposed on the first electrode 12, an organic light emitting member 14 disposed on the buffer layer 13, and a second electrode 18 disposed on the organic light emitting member 14.

The substrate 10 may include, e.g., a glass substrate, a silicon wafer, a polymer film, or the like.

The first electrode 12 may be either a cathode or an anode. In an implementation, the first electrode 12 may be a cathode. In an implementation, the first electrode 12 may be formed from metal, e.g., aluminum (Al) or aluminum alloy, silver (Ag) or silver alloy, copper (Cu) or copper alloy, or the like. In another implementation, the first electrode may be formed from, e.g., a conductive oxide. The first electrode 12 may include a single layer or multiple layers. When the first electrode 12 includes multiple layers, the multiple layers may include, e.g., a first layer including metal and a second layer including conductive oxide.

The buffer layer 13 may be formed from, e.g., a mixture of transparent conductive oxide (TCO) and metal or metal oxide.

The transparent conductive oxide may include an oxide of, e.g., indium (In), zinc (Zn), tin (Sn), and combinations thereof. The transparent conductive oxide may have a work function of about 3.0 to about 5.0 eV.

The metal or metal oxide may have a work function lower than the work function of the transparent conductive oxide. In an implementation, the metal or metal oxide may have a relatively low work function of, e.g., about 2 to about 4 eV. The metal may include, e.g., calcium (Ca), magnesium (Mg), samarium (Sm), cesium (Cs), barium (Ba), strontium (Sr), yttrium (Y), lanthanum (La), and combinations thereof. The metal oxide may include an oxide of, e.g., calcium (Ca), magnesium (Mg), samarium (Sm), cesium (Cs), barium (Ba), strontium (Sr), yttrium (Y), lanthanum (La), and combinations thereof.

The buffer layer 13 may have a work function of about 3.6 to about 4.7 eV. In an implementation, the work function of the buffer layer 13 may be between the work function of the first electrode 12 and the work function of the organic light emitting member 14. Maintaining the work function of the buffer layer 13 between the work functions of the first electrode 12 and the organic light emitting layer 14 may help facilitate charge injection and transportation from the first electrode 12 to the organic light emitting member 14.

The metal or metal oxide may be included in an amount of about 0.5 to about 20 wt % based on the total weight of buffer layer 13. Maintaining the amount of the metal or metal oxide at about 0.5 to about 20 wt % may help ensure that it is possible to appropriately decrease the work function and not significantly increase resistance as well as improve a layer property of the buffer layer 13. In an implementation, the metal or metal oxide may be included in an amount of about 2 to about 10 wt %.

The buffer layer 13 may have a transmittance of, e.g., about 80% or greater in the visible ray region, i.e., at a wavelength of about 400 to about 700 nm. When the buffer layer 13 includes a mixture of transparent conductive oxide and metal or metal oxide, the transmittance of the buffer layer 13 might be decreased due to the presence of excess metal or metal oxide, thereby deteriorating luminance. However, according to the present embodiment, the buffer layer 13 may have a transmittance of about 80% or greater in the visible ray region even when metal or metal oxide is included therein. Such a transmittance may be achieved by supplying oxygen gas during formation of the buffer layer 13. The flow rate of oxygen gas may be about 0.01 sccm to about 1 sccm. Maintaining the flow rate at about 0.01 sccm to about 1 sccm during formation of the buffer layer 13 may help ensure that the buffer layer 13 maintains an appropriate conductivity and transmittance as well as a desired work function.

The buffer layer 13 may have a thickness of about 0.1 to about 1000 Å. In an implementation, the buffer layer 13 may have a thickness of about 0.1 to about 200 Å.

The organic light emitting member 14 may have a multi-layered structure. The organic light emitting member having the multi-layered structure may include, e.g., an emitting layer 16 and auxiliary layers 15 and 17 for improving the luminous efficiency of the emitting layer 16.

The emitting layer 16 may be formed of an organic material that inherently emits light of any one of the three primary colors of red, green, and blue. In an implementation, the emitting layer 16 may be formed of a mixture of organic material and inorganic material. The emitting layer 16 may include, e.g., aluminum tris(8-hydroxyquinoline) [Alq3], anthracene, or distryl compound. The organic light emitting diode (OLED) device may display a desired image by spatial summing primary colored lights emitted from the emitting layer 16.

The auxiliary layers 15 and 17 may include, e.g., an electron transport layer (ETL) and a hole transport layer (HTL) for balancing electrons and holes as well as an electron injection layer (EIL) for enhancing injection of electrons and holes. In an implementation, the auxiliary layer 15 and 17 may include one layer or two or more layers including, e.g., the ETL, the HTL, and/or the EIL.

The second electrode 18 may be either an anode or a cathode. In an implementation, the second electrode 18 may be an anode. The second electrode 18 may be formed of an opaque conductor including, e.g., aluminum (Al) or an aluminum alloy, silver (Ag) or a silver alloy, copper (Cu), or a copper alloy, and the like. The second electrode 18 may include a single layer or multiple layers.

Hereinafter, a method of manufacturing the organic light emitting diode (OLED) device is described.

First, a first electrode 12 may be formed on the substrate 10 by, e.g., sputtering.

Then a buffer layer 13 may be formed on the first electrode 12. The buffer layer 13 may be formed from a transparent conductive oxide and a metal or metal oxide having a work function lower than a work function of the transparent conductive oxide.

The transparent conductive oxide may include an oxide of, e.g., indium (In), zinc (Zn), tin (Sn), and combinations thereof.

The metal or metal oxide may have a relatively low work function of, e.g., about 2 to about 4 eV. The metal may include, e.g., calcium (Ca), magnesium (Mg), samarium (Sm), cesium (Cs), barium (Ba), strontium (Sr), yttrium (Y), lanthanum (La), and combinations thereof. In an implementation, the metal may be different from the opaque conductor of the first electrode 12. The metal oxide may include an oxide of, e.g., calcium (Ca), magnesium (Mg), samarium (Sm), cesium (Cs), barium (Ba), strontium (Sr), yttrium (Y), lanthanum (La), and combinations thereof.

The buffer layer 13 may be formed by, e.g., sputtering, evaporation, wet coating, and the like.

In an implementation, the buffer layer 13 may be formed by, e.g., sputtering. In an implementation, the sputtering may include co-sputtering using a target of a transparent conductive oxide and a target of a metal or metal oxide.

As described above, oxygen gas may be supplied during the sputtering. The oxygen gas may be supplied at a flow rate of about 0.01 to about 1 sccm. Maintaining the flow rate at about 0.01 to about 1 sccm may help ensure that the buffer layer 13 has a work function of about 3.6 to 4.7 eV, a transmittance of about 80% or greater in the visible ray region, and a suitable conductivity. In an implementation, the buffer layer may have a work function of about 4.4 to about 4.7 eV.

An organic light emitting member 14 may be formed on the buffer layer 13. The organic light emitting member 14 may include, e.g., an emitting layer 16 and auxiliary layers 15 and 17. The organic light emitting member 14 may be formed by, e.g., a deposition process or a solution process such as an inkjet printing.

Then the second electrode 18 may be formed on the organic light emitting member 14.

The following examples illustrate this disclosure in more detail. These examples, however, are not in any sense be interpreted as limiting the scope of this disclosure.

Manufacture of Organic Light Emitting Diode Device

Al was sputtered on glass substrates and patterned to provide a first electrode. $InO_x$:CaO buffer layers including 7 wt % of CaO were formed using $InO_x$ and CaO sputtering targets. During formation of the buffer layers, the oxygen gas was supplied at flow rates of 0, 0.1 sccm, 0.2 sccm, 0.5 sccm, and 1 sccm, respectively. Then, Alq3 (aluminum tris(8-hydroxyquinoline)) was deposited on the buffer layer to provide an electron transport layer. Then, coumarin 6 was doped in 1 wt % and co-deposited on the Alq3 to provide an emitting layer. Then, NPB (N,N-dinaphthalene-1-yl-N,N-diphenyl-benzidine) was deposited on the emitting layer to provide a hole injection layer and a hole transport layer. Then, Al was deposited to provide a second electrode and complete the organic light emitting diode device.

Analysis

Change in work function and transmittance was measured according to the flow rate of the oxygen supplied gas during formation of the buffer layer.

The results are described with reference to FIG. 2 and FIG. 3.

Figure 2:
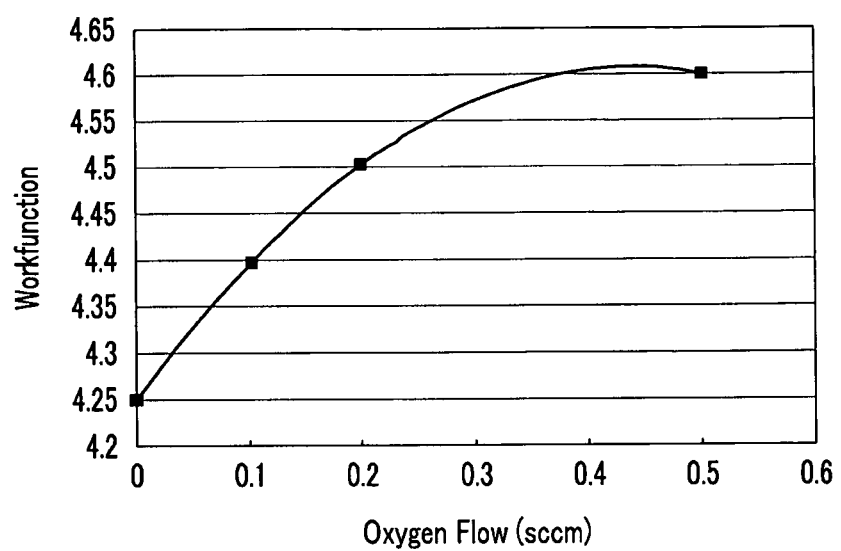
FIG. 2 illustrates a graph showing work function of a buffer layer based on a flow rate of oxygen gas supplied during formation of a buffer layer.

FIG. 2 illustrates a graph showing work function of a buffer layer based on a flow rate of oxygen gas supplied during formation of a buffer layer. FIG. 3 illustrates a graph showing transmittance of a buffer layer based on a flow rate of oxygen gas supplied during formation of a buffer layer.

Referring to FIG. 2, it may be seen that the work function was about 4.25 eV when oxygen gas was not supplied during formation of the $InO_x$:CaO buffer layer including 7 wt % of CaO. However, the work function was higher when the oxygen was supplied, e.g., about 4.4 eV or higher.

Figure 3:
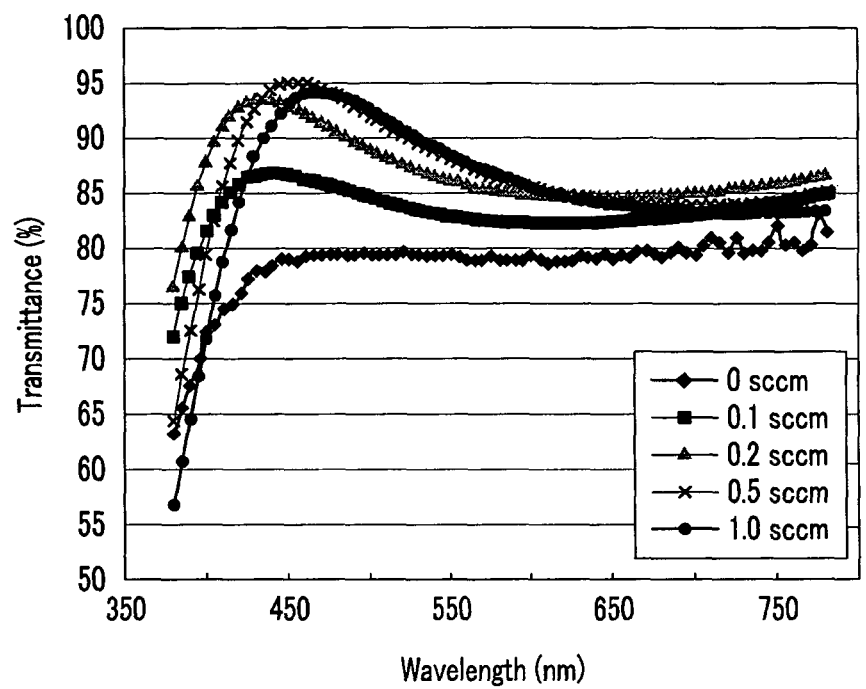
FIG. 3 illustrates a graph showing transmittance of a buffer layer based on a flow rate of oxygen gas supplied during formation of a buffer layer.

On the other hand, as illustrated in FIG. 3, the $InO_x$:CaO buffer layers including 7 wt % of CaO formed while supplying the oxygen gas exhibited higher transmittance when compared to the buffer layer formed without the supply of oxygen gas. In particular, it may be seen that as more oxygen gas was supplied, the more the transmittance was enhanced.

Referring to FIG. 2 and FIG. 3, it may be seen that the work function and transmittance have a trade-off correlation when the oxygen gas was supplied during formation of the buffer layers. In other words, when more oxygen gas was supplied during formation of the buffer layers, the transmittance of the buffer increased, but the work function of the buffer layer also increased. Accordingly, it may be desirable to adjust the flow rate of oxygen gas during formation of the buffer layer. For example, the oxygen gas may be supplied at about 0.01 to about 1 sccm in order to maintain the work function of about 3.6 to about 4.7 eV and transmittance of about 80% or greater in the visible wavelength region.

Since luminous efficiency may be proportional to a number of excitons produced in an emission layer, electrons and holes should be easily injected from an electrode to an emission layer. Accordingly, the luminous efficiency and transmittance may be enhanced by reducing a work function difference between the electrode and the emission layer to thereby facilitate charge injection and/or transportation.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) device, comprising
a substrate,
a first electrode on top of the substrate,
a buffer layer on top of the first electrode,
an emission layer on top of the buffer layer, and
a second electrode on top of the emission layer,
wherein the buffer layer includes:
a transparent conductive oxide, and
a metal or metal oxide having a work function lower than a work function of the transparent conductive oxide.

2. The OLED device as claimed in claim 1, wherein the transparent conductive oxide has a work function of about 3.0 to about 5.0 eV.

3. The OLED device as claimed in claim 2, wherein the transparent conductive oxide includes an oxide of at least one of indium, zinc, and tin.

4. The OLED device as claimed in claim 1, wherein the metal or metal oxide has a work function of about 2 to about 4 eV.

5. The OLED device as claimed in claim 4, wherein the buffer layer includes the metal, the metal including at least one of calcium, magnesium, samarium, cesium, barium, strontium, yttrium, and lanthanum.

6. The OLED device as claimed in claim 4, wherein the buffer layer includes the metal oxide, the metal oxide including an oxide of at least one of calcium, magnesium, samarium, cesium, barium, strontium, yttrium, and lanthanum.

7. The OLED device as claimed in claim 1, wherein the metal or metal oxide is included in an amount of about 0.5 wt % to about 20 wt % based on a total weight of the buffer layer.

8. The OLED device as claimed in claim 1, wherein the buffer layer has a work function of about 3.6 eV to about 4.7 eV.

9. The OLED device as claimed in claim 1, wherein the buffer layer has a transmittance of about 80% or greater at a wavelength of about 400 nm to about 700 nm.

10. The OLED device as claimed in claim 1, wherein the buffer layer has a thickness of about 0.1 Å to about 1000 Å.

11. A method of manufacturing an organic light emitting diode (OLED) device, the method comprising
forming a first electrode on a substrate,
forming a buffer layer on the first electrode,
forming an emission layer on the buffer layer, and
forming a second electrode on the emission layer,
wherein the buffer layer includes:
a transparent conductive oxide, and
a metal or metal oxide having a work function lower than a work function of the transparent conductive oxide.

12. The method as claimed in claim 11, wherein the buffer layer includes the metal, the metal including at least one of calcium, magnesium, samarium, cesium, barium, strontium, yttrium, and lanthanum.

13. The method as claimed in claim 11, wherein the buffer layer includes the metal oxide, the metal oxide including an oxide of at least one of calcium, magnesium, samarium, cesium, barium, strontium, yttrium, and lanthanum.

14. The method as claimed in claim 11, wherein forming the buffer layer includes sputtering, evaporating, or wet coating.

15. The method as claimed in claim 11, wherein forming the buffer layer includes co-sputtering using a target of transparent conductive oxide and a target of metal or metal oxide.

16. The method as claimed in claim 15, wherein oxygen gas is supplied during the sputtering.

17. The method as claimed in claim 16, wherein the oxygen gas is supplied at a flow rate of about 0.01 sccm to about 1 sccm.

18. The method as claimed in claim 11, wherein the buffer layer has a work function of about 3.6 eV to about 4.7 eV and a transmittance of about 80% or greater at a wavelength region of about 400 nm to about 700 nm.

19. The method as claimed in claim 18, wherein the metal or metal oxide has a work function of about 2 eV to about 4 eV.

20. The method as claimed in claim 19, wherein the transparent conductive oxide has a work function of about 3.0 eV to about 5.0 eV.

* * * * *